United States Patent
Iancu et al.

(10) Patent No.: US 9,659,764 B2
(45) Date of Patent: May 23, 2017

(54) METHOD OF CONTROLLED CRACK PROPAGATION FOR MATERIAL CLEAVAGE USING ELECTROMAGNETIC FORCES

(71) Applicant: The Board of Trustees of the Leland Stanford Junior University, Palo Alto, CA (US)

(72) Inventors: Andrei T. Iancu, Stanford, CA (US); Friedrich B. Prinz, Woodside, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 365 days.

(21) Appl. No.: 14/469,983

(22) Filed: Aug. 27, 2014

(65) Prior Publication Data

US 2015/0060509 A1    Mar. 5, 2015

Related U.S. Application Data

(60) Provisional application No. 61/871,820, filed on Aug. 29, 2013.

(51) Int. Cl.
*B26F 3/00* (2006.01)
*H01L 21/02* (2006.01)
(Continued)

(52) U.S. Cl.
CPC ...... *H01L 21/02021* (2013.01); *B28D 5/0011* (2013.01); *H01L 21/02019* (2013.01);
(Continued)

(58) Field of Classification Search
CPC ......... H01L 21/02019; H01L 21/02021; H01L 21/306; B28D 5/0011; Y10T 225/12; Y02P 80/30
(Continued)

(56) References Cited

U.S. PATENT DOCUMENTS 6,548,382 B1    4/2003   Henley et al.
2002/0185685 A1*  12/2002  Ju ..................... H01L 21/76254
                                                                    257/347

(Continued)

*Primary Examiner* — Kenneth E. Peterson
*Assistant Examiner* — Samuel A Davies
(74) *Attorney, Agent, or Firm* — Lumen Patent Firm

(57) ABSTRACT

To address the needs in the art, a method of cleaving substrate material that includes forming an initial crack in a bulk substrate material, where the crack is aligned along a cleaving plane of the bulk substrate material, aligning the cleaving plane between two parallel electrodes in a controlled environment, wherein the parallel electrodes include a top electrode and a bottom electrode, where the cleaving plane is parallel with the two parallel electrodes, where a bottom portion of the bulk substrate material is physically and electrically connected to the bottom electrode, and applying a voltage across the two parallel electrodes, where the voltage is at least 50 kV and establishes a uniform electromagnetic force on the top surface of the bulk substrate material, where the electromagnetic force is capable of inducing crack propagation along the cleaving plane and separating a cleaved substrate material from the bulk substrate material.

13 Claims, 5 Drawing Sheets

(51) Int. Cl.
*B28D 5/00* (2006.01)
*H01L 21/306* (2006.01)

(52) U.S. Cl.
CPC ............ *H01L 21/306* (2013.01); *Y02P 80/30* (2015.11); *Y10T 225/12* (2015.04)

(58) Field of Classification Search
USPC .................... 438/460–465; 225/2, 93–97
See application file for complete search history.

(56) References Cited

U.S. PATENT DOCUMENTS

| | | | |
|---|---|---|---|
| 2006/0141747 A1* | 6/2006 | Henley | B81C 1/0038 438/455 |
| 2007/0033782 A1* | 2/2007 | Taliashvili | H01J 9/02 29/25.02 |
| 2009/0230503 A1* | 9/2009 | Shimomura | H01L 27/1214 257/506 |
| 2009/0246937 A1* | 10/2009 | Yamazaki | H01L 21/02057 438/458 |
| 2013/0032582 A1* | 2/2013 | Henley | B23K 26/362 219/121.18 |

* cited by examiner

METHOD OF CONTROLLED CRACK PROPAGATION FOR MATERIAL CLEAVAGE USING ELECTROMAGNETIC FORCES

CROSS-REFERENCE TO RELATED APPLICATIONS

This application claims priority from U.S. Provisional Patent Application 61/871820 filed Aug. 29, 2013, which is incorporated herein by reference.

FIELD OF THE INVENTION

The current invention relates to cleaving material. More specifically, the invention relates to a high throughput and low cost method of cleaving materials.

BACKGROUND OF THE INVENTION

In semiconductor processing, bulk-grown crystals are often processed into wafers by sawing. Unfortunately, this can result in very high material loss (e.g., roughly 50%), which undesirably increases cost.

What is needed is a method of separating substrate materials that improves cleaved substrate output and reduces cost.

SUMMARY OF THE INVENTION

To address the needs in the art, a method of cleaving substrate material that includes forming an initial crack in a bulk substrate material, where the crack is aligned along a cleaving plane of the bulk substrate material, aligning the cleaving plane between two parallel electrodes in a controlled environment, wherein the parallel electrodes include a top electrode and a bottom electrode, where the cleaving plane is parallel with the two parallel electrodes, where a bottom portion of the bulk substrate material is physically and electrically connected to the bottom electrode, and applying a voltage across the two parallel electrodes, where the voltage is at least 50 kV and establishes a uniform electromagnetic force on the top surface of the bulk substrate material, where the electromagnetic force is capable of inducing crack propagation along the cleaving plane and separating a cleaved substrate material from the bulk substrate material.

According to one aspect of the invention, forming the initial crack includes using masked dry etching, masked plasma etching, masked vapor etching, masked wet etching, mechanical scribing, mechanical indentation, or laser ablation.

In another aspect of the invention, the controlled environment includes a vacuum-compatible chamber, wherein the vacuum-compatible chamber comprises a dielectric gas. In one aspect of this embodiment, the dielectric gas has a pressure in a range of $10^{-12}$ to 10 torr. In other aspects of this embodiment, the dielectric gas includes dry nitrogen, nitrous oxide or sulfur hexafluoride.

In a further aspect of the invention, the controlled environment includes a pressure-compatible chamber, where the pressure-compatible chamber has a dielectric gas. In one aspect of this embodiment, the dielectric gas has a pressure in a range of 1,000 to 80,000 torr. In further aspects of this embodiment, the dielectric gas comprises dry nitrogen, nitrous oxide or sulfur hexafluoride.

According to another aspect of the invention, the controlled environment includes a pressure-compatible chamber having a dielectric liquid. According to different aspects of this embodiment, the dielectric liquid comprises silicone oil, hexane, transformer oil, liquid nitrogen, or liquid oxygen.

According to another aspect of the invention, the voltage can be a switched DC voltage, a set of voltage pulses or a switched AC voltage.

In yet another aspect of the invention, the bulk substrate material can include silicon, gallium arsenide, indium phosphide or germanium.

According to a further aspect of the invention, an insulating material is positioned between the cleaved substrate material and the top electrode, where the insulating material protects the top electrode.

DETAILED DESCRIPTION

Figure 2A:
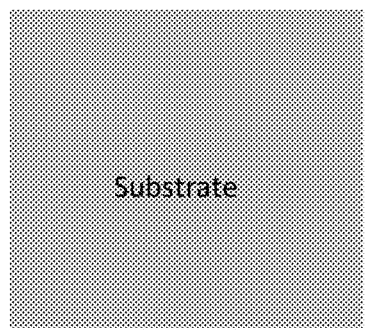
FIGS. 2a-2d show schematic drawings of substrates 2a before an initial crack, 2b a non-conductive substrate with a conducting film, 2c a substrate with a single initial crack, and 2d a substrate with an array of initial cracks, according to embodiments of the invention.
Figure 2B:
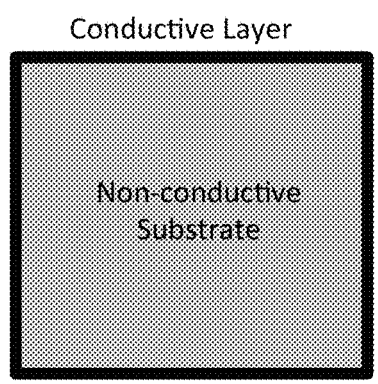
Figure 2C:
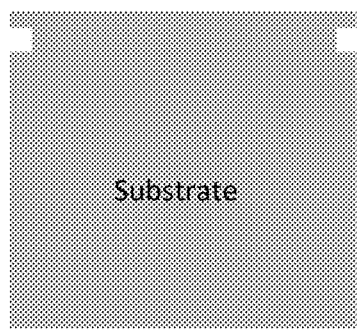
Figure 2D:
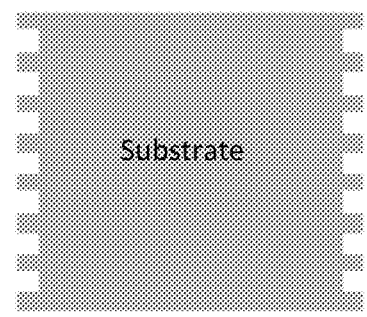

The current invention provides a very high throughput and low cost method of cleaving virtually any material. In one embodiment, the invention is directed towards semiconductor industry materials such as silicon, gallium arsenide, indium phosphide or germanium. In another embodiment, the invention is directed to other cases where precision cleaving is desired. According to the invention, an initial crack or set of cracks is first formed in the substrate or material to be cleaved in a desired plane of cleavage making sure to fully define the plane such that the subsequent propagation of cracks will all converge along this desired path (see FIGS. 2c-2d). The depth of the cracks is based on the fracture toughness of the material at hand and the maximum magnitude of electromagnetic force that can be applied. The width of the initial cracks is determined by the method used for crack formation and should be minimized as much as possible in order to increase the accuracy of the cleavage and to minimize unnecessary material loss. Any method may be used for the initial crack formation such as masked dry etching, masked plasma etching, masked vapor etching, masked wet etching, mechanical scribing/indentation, laser ablation and so forth.

Figure 1A:
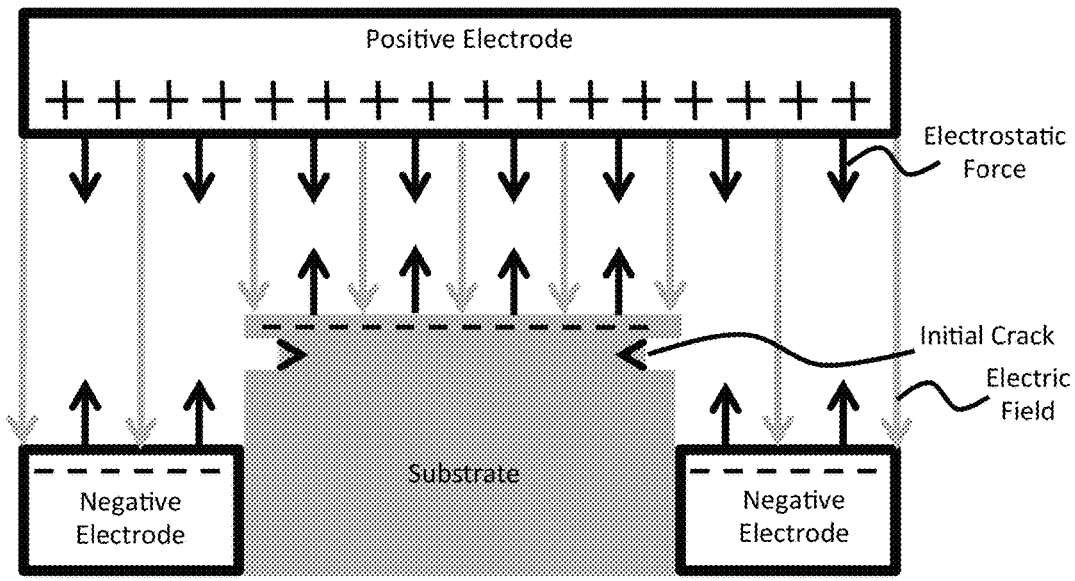
FIGS. 1a-1b show schematic drawings of the cleaving apparatus, where 1a shows a substrate with an initial crack placed between two electrodes in a chamber and subject to an electrostatic force from an electric field, and 1b shows a cleaved substrate removed from the substrate while in the chamber, according to one embodiment of the invention.
Figure 1B:
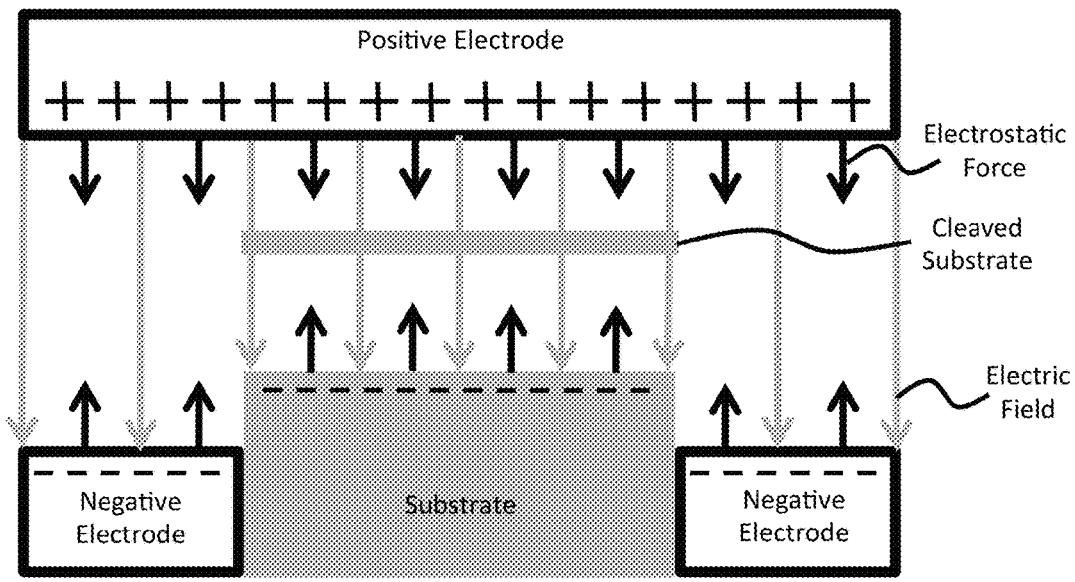

Once the initial crack set and plane of cleavage are fully defined, the substrate material to be cleaved is placed in a controlled environment between two parallel, flat, polished metal electrodes (see FIGS. 1a-1b). The plane of cleavage is aligned such that it is parallel to the two electrodes. The bulk substrate material itself is also physically and electrically connected to one of the electrodes. A very large voltage, generally at least 50 kV, is then applied between the two electrodes in order to generate a powerful and uniform electromagnetic force on the surface of the material to be cleaved. This electromagnetic force will effectively cause rapid crack propagation along the previously marked cleavage plane. If the cracks are properly sized and aligned, the material will be split along the cleavage plane within a fraction of a second and the cleaved piece of material will be immediately attracted to the opposite electrode to which the bulk substrate material was attached. According to further embodiments, the opposite electrode can be positioned proximal or away from the material piece to be cleaved.

Figure 3A:
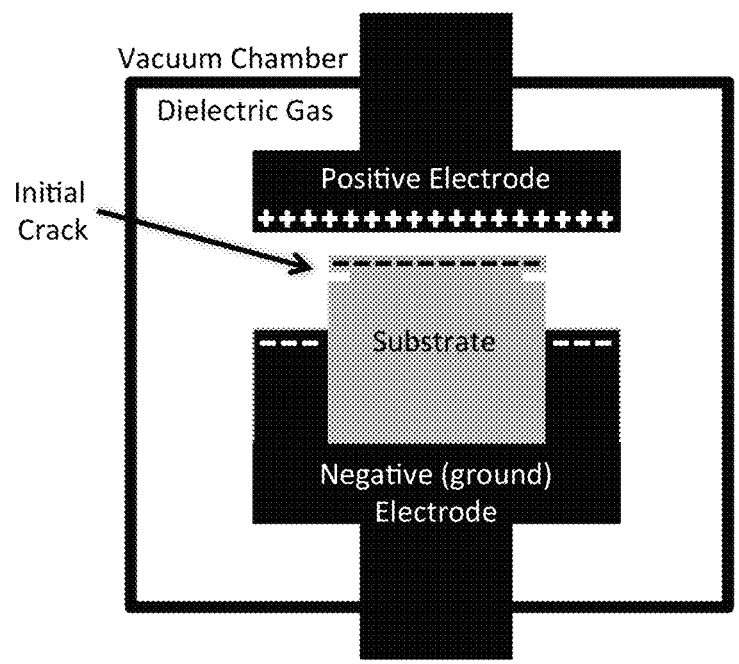
FIGS. 3a-3b show a substrate with 3a an initial crack placed between a positive electrode and a negative/ground electrode in a chamber, and 3b shows a cleaved substrate removed from the substrate while in the chamber, according to embodiments of the invention.
Figure 3B:
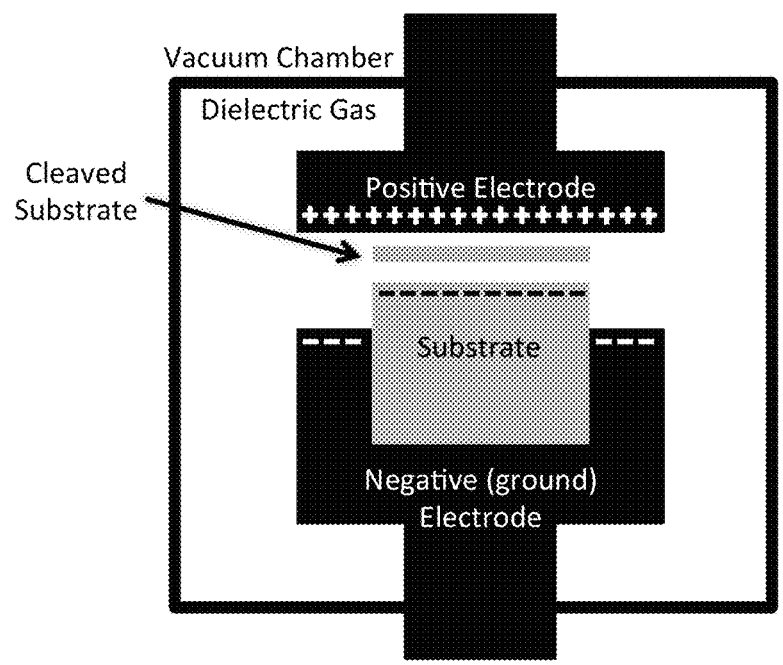
Figure 3C:
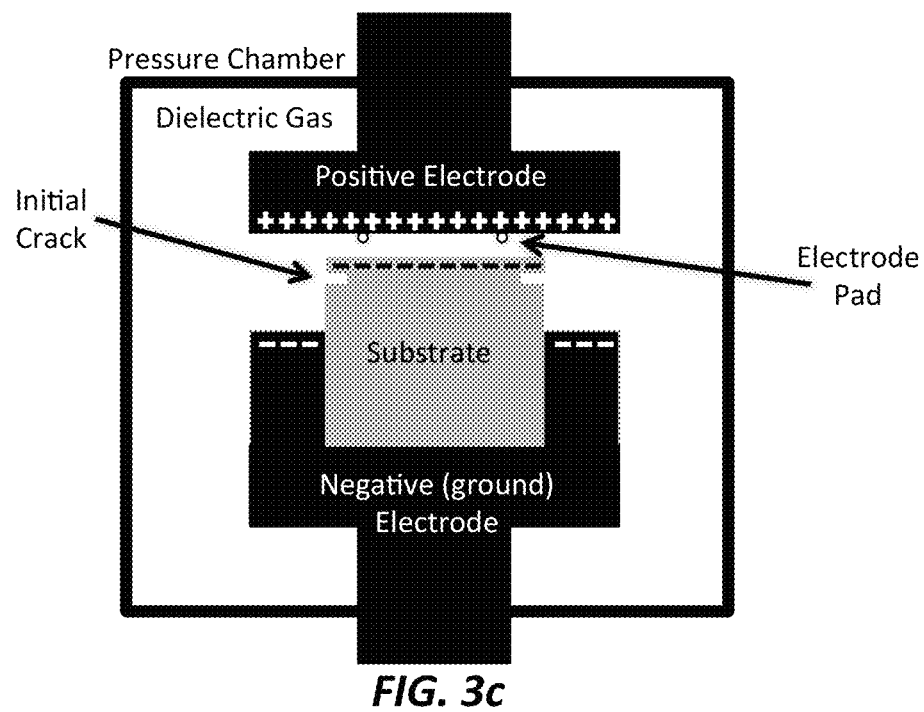
FIGS. 3c-3d show an electrode pad disposed on the positive electrode for protection, according to one embodiment of the invention.
Figure 3D:
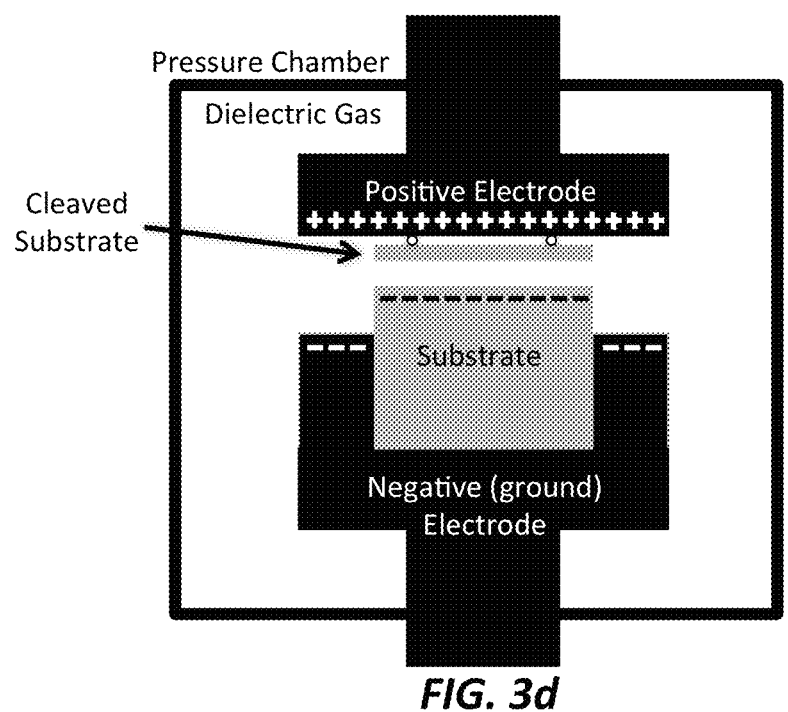
Figure 3E:
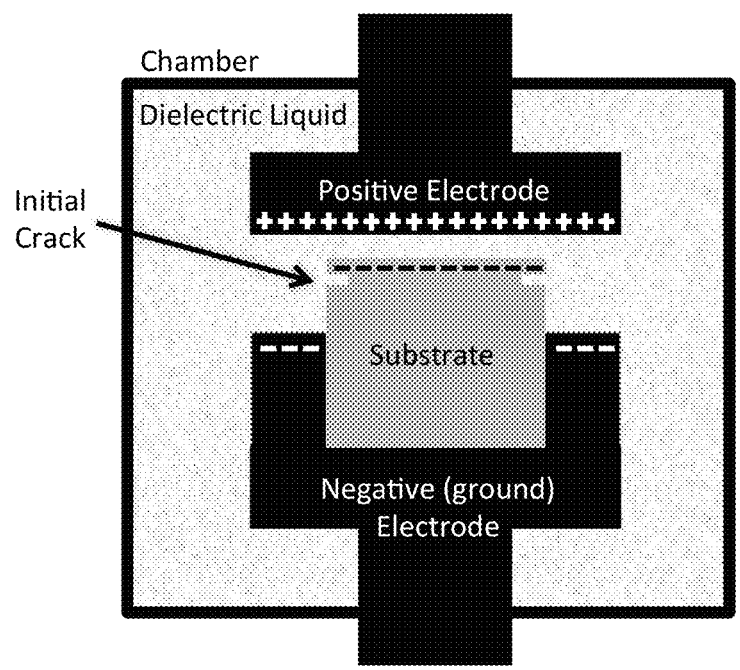
FIGS. 3e-3f shows a high-dielectric liquid within the chamber, according to one embodiment of the invention.
Figure 3F:
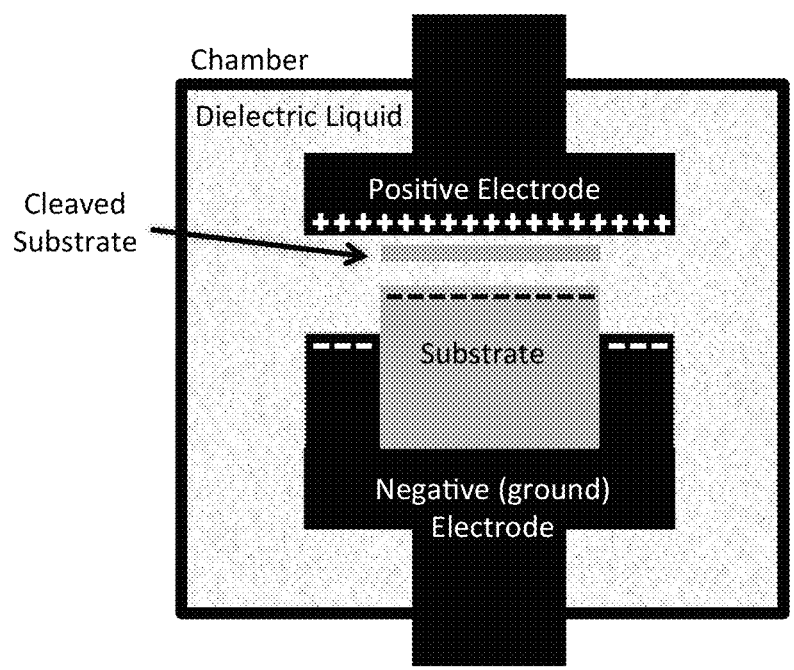

The controlled environment in which the substrate material and electrodes are placed is one such that the very large voltage applied to the electrodes does not cause electrical breakdown between them. There are three primary methods of achieving this goal. The first involves using a vacuum-compatible chamber (see FIGS. 3a-3b), which has been filled with a high dielectric strength gas such as dry nitrogen, nitrous oxide or sulfur hexafluoride then pumped down to vacuum pressure in a range of $10^{-12}$ to 10 torr. The second method involves a high-pressure compatible chamber (see FIGS. 3c-3d), which has been filled with a high dielectric strength gas such as dry nitrogen, nitrous oxide or sulfur hexafluoride in which the gas pressure has been increased to a pressure in a range of 1,000 to 80,000 torr. The third involves a chamber at atmospheric pressure (see FIGS. 3e-3f) that is filled with a high dielectric strength liquid such as silicone oil, hexane, transformer oil, liquid nitrogen, liquid oxygen and so forth. In all of these cases, the breakdown field strength of the volume between the electrodes will be increased to a level above that of the applied electric field used for the substrate material cleavage.

In one embodiment, the material to be cleaved is preferably somewhat conductive such that the voltage applied between the two electrodes generates an electric field, which terminates at the surface of the material as opposed to the surface of the electrode to which the material is connected (see FIGS. 1a-1b). If the material is insulating, it can first be coated with a thin conductive layer (see FIG. 2b), which is strongly bonded to the material surface. This coating can be accomplished by any number of techniques including metal sputtering, metal evaporation, atomic layer deposition, chemical vapor deposition, electrodeposition, spray pyrolysis and so forth. The conductive coating may be removed after the cleaving process is complete.

During the crack propagation step, the material is cleaved and the cleaved piece will be strongly attracted to the opposing electrode. To prevent damage to the electrode, an arresting layer of electrically insulating material (see FIGS. 3c-3d) preferably covers the electrode or is suspended between the material and the opposing electrode to catch and hold the cleaved piece. Any dielectric material that will not significantly affect the electromagnetic field distribution between the electrodes and cleaved material may be used, but its mechanical properties should allow it to withstand the powerful forces exerted on it by the cleaved piece as it is accelerated toward the opposing electrode.

The voltage applied between the two electrodes may be a switched DC voltage, a set of voltage pulses or a switched AC voltage. If the magnitude of the voltage is greater than that required for crack propagation, it produces similar results. A DC voltage where the voltage application duration is slightly longer than the time necessary for full crack propagation through the cleavage plane is optimal from an energy use perspective. A pulsed voltage system is necessary when the required voltage magnitude for crack propagation is too large to be provided by a DC supply.

The most important and immediate application of this invention is in the kerfless cleaving of silicon and other semiconductor material ingots. The cylindrical ingots that are fabricated by the various melt growth methods of the industry can be easily and cheaply cleaved into wafers of virtually any thickness. The approach is also applicable to any other case of precision crystal cleaving.

The present approach provides significant advantages. This method is more economical than existing methods just based on the fact that it almost completely eliminates material loss. Additionally, the corresponding equipment is relatively low cost and does not require significant maintenance with time. Finally, the physics of the cleaving process is amenable to very high throughput, which makes it much more attractive for industrial use than current methods which usually involve slow and dirty sawing processes or complex and damaging ion implantation steps.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, variations in the geometry of the material to be cleaved are possible, where complex geometries can be cleaved by modifications to the electrode sizes and shapes. Further, variations in the environment in which the cleaving occurs such as a low-pressure vacuum chamber containing a high dielectric strength gas, a very high pressure chamber containing a high dielectric strength gas or an atmospheric pressure chamber with a high dielectric strength liquid can be used. In the vacuum and high-pressure chamber cases, the gases present in the system are controlled to ensure that they have high dielectric strength and provide the proper chamber pressure. The choice of operating environment will affect initial system cost as well as maintenance costs. Additionally, variations in the type of voltage source used are possible, where some materials may be cleaved with only a properly switched DC source while others may require higher voltage pulsed sources. The required magnitude of the applied voltage is based on the force necessary to propagate the initial cracks throughout the cleavage plane.

All such variations are considered to be within the scope and spirit of the present invention as defined by the following claims and their legal equivalents.

What is claimed:
1. A method of cleaving substrate material, comprising:
   a. forming an initial crack in a bulk substrate material, wherein said crack is aligned along a cleaving plane of said bulk substrate material;
   b. aligning said cleaving plane between two parallel electrodes in a controlled environment, wherein said parallel electrodes comprise a top electrode and a bottom electrode, wherein said cleaving plane is parallel with said two parallel electrodes, wherein a bottom portion of said bulk substrate material is physically and electrically connected to said bottom electrode; and
   c. applying a voltage across said two parallel electrodes, wherein said voltage is at least 50 kV, wherein said voltage establishes a uniform electromagnetic force on said top surface of said bulk substrate material, wherein said electromagnetic force induces crack propagation along said cleaving plane and separates a cleaved substrate material from said bulk substrate material.

2. The method according to claim 1, wherein forming said initial crack comprises using masked dry etching, masked plasma etching, masked vapor etching, masked wet etching, mechanical scribing, mechanical indentation, or laser ablation.

3. The method according to claim 1, wherein said controlled environment comprises a vacuum-compatible chamber, wherein said vacuum-compatible chamber contains a dielectric gas.

4. The method according to claim 3, wherein said dielectric gas has a pressure in a range of $10^{-12}$ to 10 torr.

5. The method according to claim 3, wherein said dielectric gas comprises dry nitrogen, nitrous oxide or sulfur hexafluoride.

6. The method according to claim 1, wherein said controlled environment comprises a pressure-compatible chamber, wherein said pressure-compatible chamber contains a dielectric gas.

7. The method according to claim 6, wherein said dielectric gas has a pressure in a range of 1,000 to 80,000 torr.

8. The method according to claim 6, wherein said dielectric gas comprises dry nitrogen, nitrous oxide or sulfur hexafluoride.

9. The method according for claim 1, wherein the controlled environment comprises a chamber at atmospheric pressure, wherein said chamber contains a dielectric liquid.

10. The method according to claim 9, wherein said dielectric liquid comprises silicone oil, hexane, transformer oil, liquid nitrogen, or liquid oxygen.

11. The method according to claim 1, wherein said voltage comprises a switched DC voltage, a set of voltage pulses or a switched AC voltage.

12. The method according to claim 1, wherein said bulk substrate material comprises silicon, gallium arsenide, indium phosphide or germanium.

13. The method according to claim 1, wherein an insulating material is positioned between said cleaved substrate material and said top electrode, wherein said insulating material protects said top electrode.

* * * * *